United States Patent [19]

Nishimura et al.

[11] Patent Number: 5,450,813
[45] Date of Patent: Sep. 19, 1995

[54] METHOD FOR MANUFACTURING NITROGEN-DOPED GROUP II-VI COMPOUND SEMICONDUCTOR THIN FILMS

[75] Inventors: Kohsuke Nishimura, Kawagoe; Yasuyuki Nagao; Kazuo Sakai, both of Tokyo, all of Japan

[73] Assignee: Kokusain Denshin Denwa Kabushiki Kaisha, Tokyo, Japan

[21] Appl. No.: 205,953

[22] Filed: Mar. 3, 1994

[30] Foreign Application Priority Data

Mar. 18, 1993 [JP] Japan .................. 5-082462

[51] Int. Cl.6 .......................... C30B 23/06
[52] U.S. Cl. ...................... 117/84; 117/108; 117/200; 117/204
[58] Field of Search ............ 117/84, 108, 200, 204; 437/16, 934, 987

[56] References Cited

U.S. PATENT DOCUMENTS 4,038,174 7/1977 Myers ..................... 117/84

FOREIGN PATENT DOCUMENTS 2208287 8/1990 Japan ................... 117/108

*Primary Examiner*—R. Bruce Breneman
*Assistant Examiner*—Felisa Garrett
*Attorney, Agent, or Firm*—Emmanuel J. Lobato

[57] ABSTRACT

Nitrogen-doped group II-VI compound semiconductor thin film manufacturing method and apparatus which are applicable to an MOVPE process. The group II-VI compound semiconductor thin film manufacturing method according to the present invention is characterized by the use of osmium as a catalyst to activate nitrogen molecules. The growth device according to the present invention has a construction wherein a nitrogen gas introducing pipe for blowing a nitrogen gas against a semiconductor substrate is disposed in a reaction chamber for growing the group II-VI compound semiconductor thin film by the MOVPE process and the osmium is disposed between the semiconductor substrate and the nitrogen gas introducing pipe.

3 Claims, 4 Drawing Sheets

METHOD FOR MANUFACTURING NITROGEN-DOPED GROUP II-VI COMPOUND SEMICONDUCTOR THIN FILMS

BACKGROUND OF THE INVENTION

The present invention relates to a method and an apparatus for manufacturing nitrogen-doped group II-VI compound semiconductor films.

Group II-VI compounds, which consist of group II elements such as zinc, cadmium, mercury and magnesium and group VI elements such as sulfur, selenium and tellurium, are semiconductors whose energy gaps range from the far infrared to the near ultraviolet and have now various uses, including an infrared sensor and a fluorescent material. Moreover, they are being investigated very actively for development as materials for blue and green color light emitting devices especially in recent years.

Of these group II-VI compounds, zinc sulfide (ZnS) and zinc solenoid (ZnSe) which have particularly large energy gaps are difficult of forming a p-type layer. To obtain a p-type layer of wide energy gap group II-VI compound semiconductors, the compounds need to be doped with lithium, sodium or a similar group I element or nitrogen, phosphorus or a similar group V element which serves as a p-type dopant In order that these dopants effectively act as acceptors, it is necessary that group I atoms substitute for group II atoms or group V atoms for group VI atoms. In a case where the group I element is used as the p-type dopant, however, these atoms are allowed to easily migrate to interstitial positions; hence, some of the doped atoms act as a donnor and a high mole concentration cannot be obtained. In case of using a group V element as a p-type dopant, if phosphorus or arsenic is doped in excess of a certain concentration, group V atoms are associated with themselves or with atomic vacancies to form carrier trapping centers and as high mole concentration cannot be obtained. It has been known, up to now, that in wide energy gap group II-VI compound semiconductors using such group I or V elements as dopants, a p-type layer of a practical hole concentration could be obtained only when using nitrogen, a group V element, as a dopant.

It had been difficult until several years ago, however, to dope nitrogen into the group II-VI compound semiconductor. Recently nitrogen can be doped by a method of exciting a nitrogen molecular gas in the form of a plasma, but this method is applicable only in the case of a molecular beam epitaxy (MBE) method which performs crystal growth under highly evacuated conditions; it is hard to apply the metal organic vapor phase epitaxy (MOVPE) method which conducts growth in a carrier gas as of hydrogen under low evacuated conditions.

An attempt has also been made to dope nitrogen in the MOVPE method using a nitrogen compound such as ammonia or trimethylamine. However, it is not become effective because the nitrogen compound has a high decomposition temperature and does not liberate nitrogen at such a low temperature as an ordinary growth temperature. Moreover, in case of using a compound in which nitrogen and hydrogen have a direct bond, such as ammonia, there is also presented a problem that a part of the nitrogen-hydrogen bonds is not cleaved and is incorporated intact in crystals.

The MOVPE method is relatively simple in the device configuration as compared with the MBE method, and hence is advantageous over the latter in terms of cost, maintenance, etc. It would be highly beneficial, therefore, if nitrogen could be doped in the MOVPE method. In case of doping nitrogen in the form of a plasma in the MBE method, a plasma generating device requires a high-frequency and a high voltage and high energy species in the plasma need to be removed so that crystals being grown are not irradiated with them. This inevitably leads to complexity in the device configuration. Thus, a simple method for doping the nitrogen in the MBE process would also be of great utility.

As described above, it is difficult in the MOVPE process to dope the nitrogen in the form of a plasma. The reason for this is that the nitrogen activated by being put in the state of a plasma collides with other gas molecules and becomes inactive again.

SUMMARY OF THE INVENTION

An object of the present invention is to provide a nitrogen doped group II-VI compound semiconductor thin film manufacturing or forming method and apparatus which are applicable to the MOVPE process.

To attain the above object, the group II-VI compound semiconductor thin film manufacturing method according to the present invention is characterized by the use of osmium as a catalyst to activate nitrogen molecules.

A first growth device according to the present invention is an MOVPE growth device which is characterized in that a reaction chamber for growing a group II-VI compound semiconductor thin film through the MOVPE process includes: a heating susceptor for placing a semiconductor substrate; a nitrogen gas introducing pipe for blowing a nitrogen gas against the semiconductor substrate; and a heating susceptor for placing osmium which is adapted so that the osmium is disposed near the semiconductor substrate between it and the nitrogen gas introducing pipe.

A second growth device according to the present invention is an MBE growth device which is characterized in that a reaction chamber for growing a group II-VI compound semiconductor thin film through the MBE process includes: a substrate holder for placing a semiconductor substrate; a plurality of crucibles with heaters for irradiating the semiconductor substrate with molecular beams; and a nitrogen gas introducing pipe disposed to introduce a nitrogen gas into one of the crucibles, osmium being placed in the said one crucible.

When heated to high temperatures above 160° C., the osmium chemically adsorbs nitrogen molecules. The thus adsorbed nitrogen is active immediately after being released from the osmium surface again. This active nitrogen immediately returns to inactive nitrogen molecules upon collision with other molecules, as is the case with the nitrogen put in a plasma. However, since the nitrogen can easily be disposed in close proximity to the substrate unlike in a plasma generating device, it can be supplied to the substrate while being active even in the MOVPE device. Moreover, since the active nitrogen can be supplied simply by heating, the device can be made far simpler than the plasma generating device. Thus, this method is of great utility also when applied to the MBE device.

BRIEF DESCRIPTION OF THE DRAWINGS

The present invention will be described in detail below with reference to the accompanying drawings, in which.

DETAILED DESCRIPTION

[Embodiment 1]

Figure 1A:
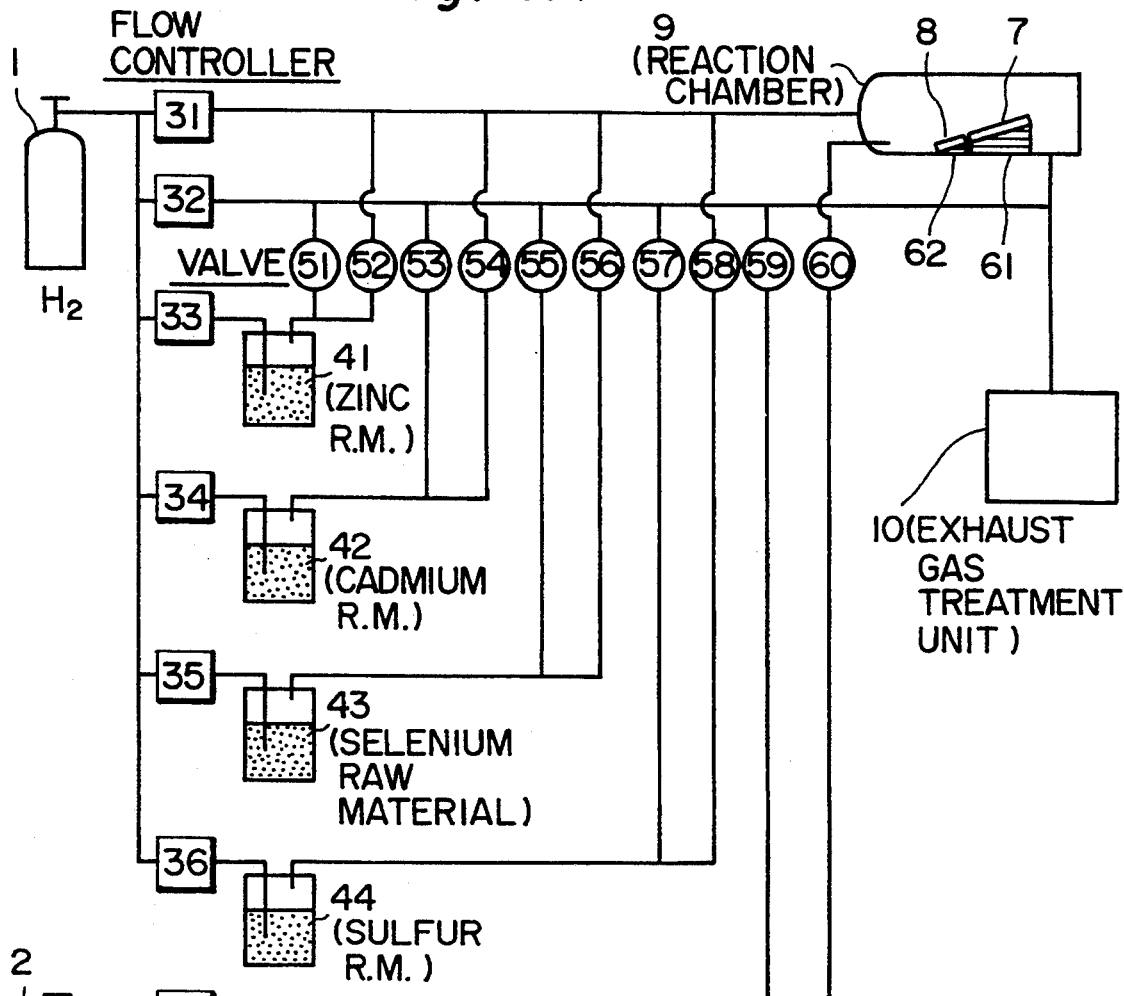
FIG. 1A is a system diagram illustrating an example of the present invention applied to an MOVPE device using a znCdSSe material.
Figure 1B:
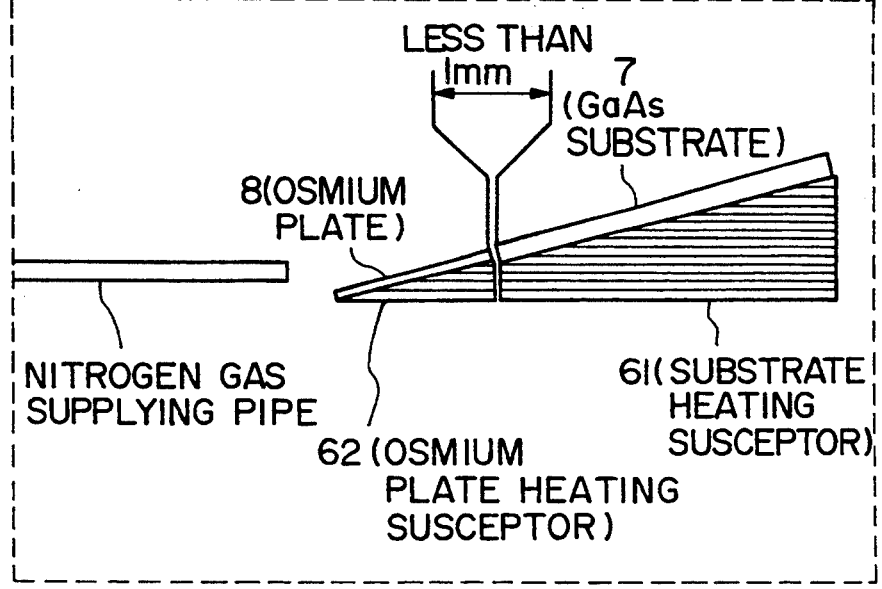
FIG. 1B is an enlarged view illustrating an example of an arrangement of members in a reaction chamber shown in FIG. 1A.

FIGS. 1A and 1B illustrate an example of the application of the present invention to an MOVPE device using a ZnCdSSe material. Reference numeral 1 denotes a high purity hydrogen gas cylinder, 2 a high purity nitrogen gas cylinder, 31 through 37 flow controllers, 41 a zinc raw material (diethyzinc, for example), 42 a cadmium raw material (dimethylcadmium for example), 43 a selenium raw material (tertiary butyl selenol, for example), 44 a sulfur raw material (tertiary butane thiol, for example), 51 through 60 raw material passage change-over valves; 61 a susceptor made of carbon for heating a substrate, 62 a susceptor made of carbon for heating an osmium plate, 7 a GaAs substrate, 8 an osmium plate, 9 a reaction chamber made of quartz glass, and 10 an exhaust gas treatment device. In the drawings, there are shown only parts related to the invention and instruments usually provided in the MOVPE device, such as a pressure gauge and valves, are not shown for the sake of brevity. It is a feature of the present invention that the osmium plate 8 provided with a heater is disposed in close proximity to the substrate heating susceptor 61. The substrate heating susceptor 61 and the osmium plate heating susceptor 62 can be controlled in temperature independently of each other through the use of a resistance heating system. The nitrogen introduced into the reaction tube 9 is once chemically adsorbed onto the surface of the osmium plate 8 being heated. After a certain elapsed time the adsorbed nitrogen is deserted from the surface of the osmium plate 8 and reaches to the vicinity of the substrate 7 while remaining active. Then it is physically adsorbed onto the surface of the group II-VI compound being grown and incorporated into crystals.

Figure 2:
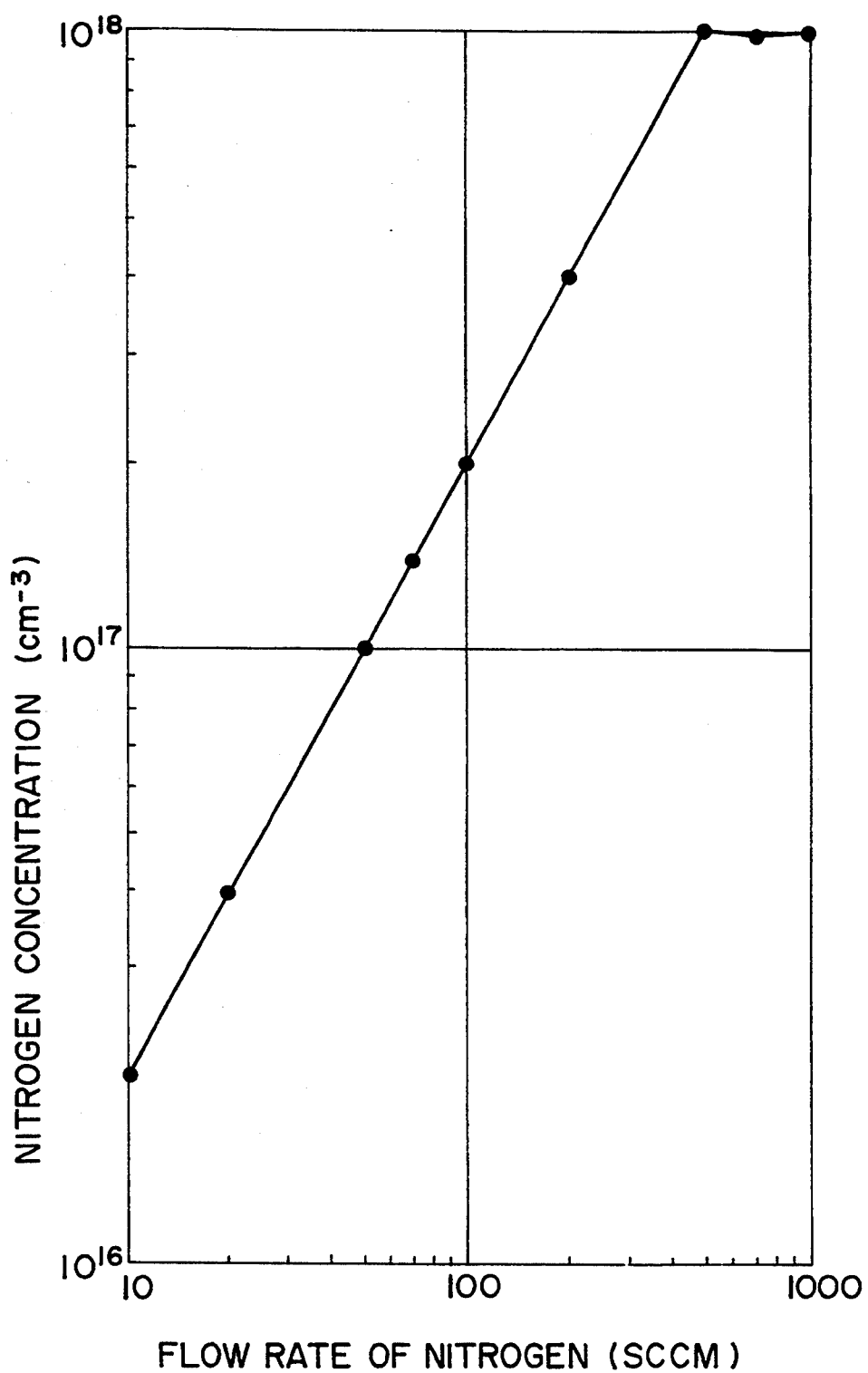
FIG. 2A is a graph showing the relationships of a ZnSe crystal grown by the device of FIG. 1A to the flow rate of nitrogen supplied and the nitrogen concentration in the thin film.

FIG. 2 shows the relationship of a ZnSe crystal grown by the above-described device to the flow rate of nitrogen supplied and the nitrogen concentration in the group II-VI compound thin film The temperature for growth is 300° C. the flow rate of diethylzinc is 10 μmol/min and the flow rate of tertiary butyl selenol is 20μmol/min. A maximum nitrogen concentration of $1 \times 10^{18}$ cm$^{-3}$ is obtained, which indicates that the nitrogen is doped effectively. [Embodiment 2]

Figure 3A:
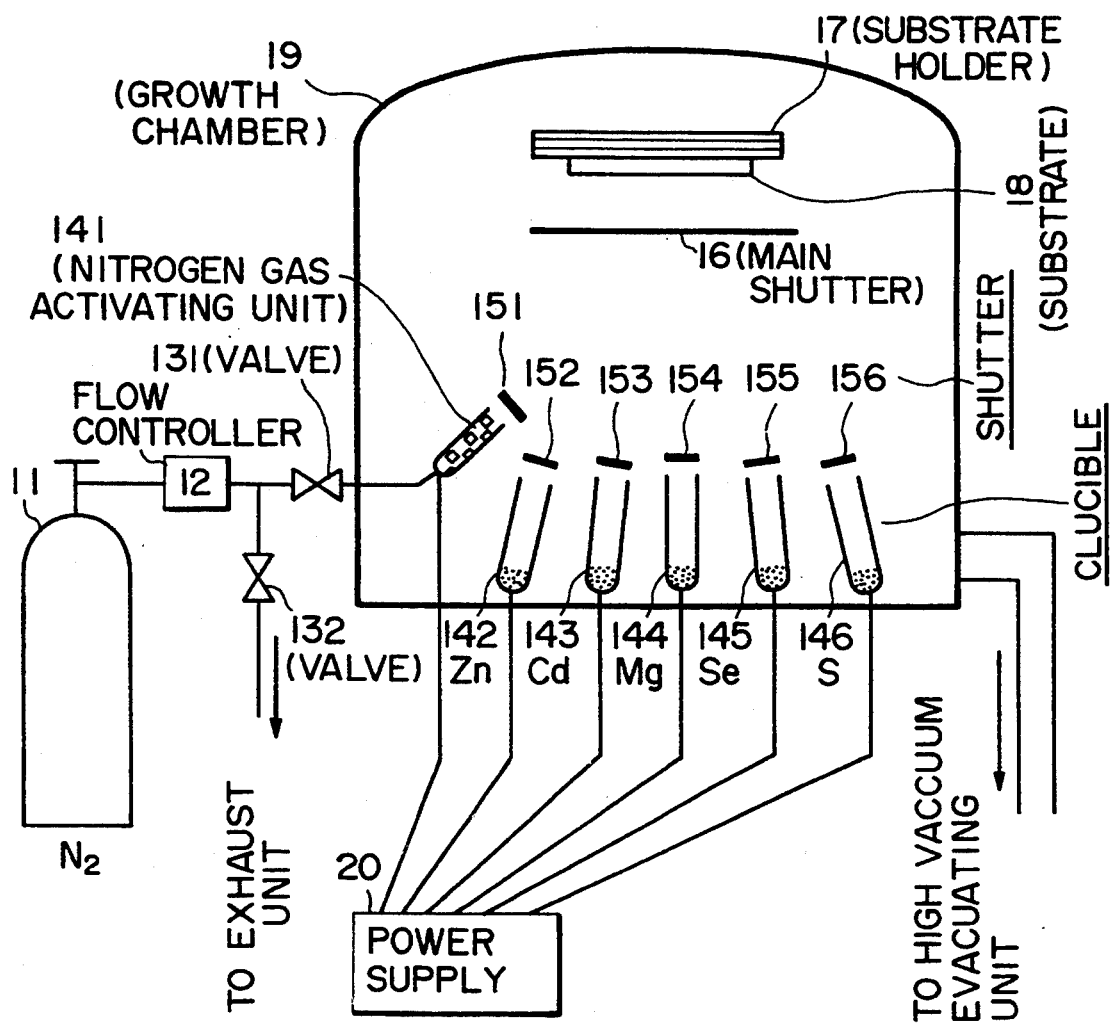
FIG. 3A is a system diagram illustrating an example of the present invention applied to an MBE device using a MgZnCdSSe material.
Figure 3B:
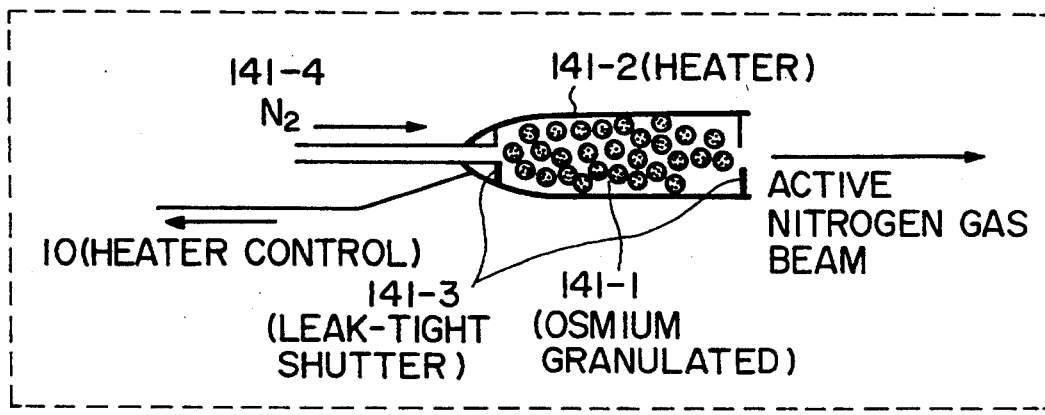
FIG. 3B is an enlarged view illustrating an example of an arrangement of members near an activation unit shown in FIG. 3A.

FIGS. 3A and 3B illustrate an example of the application of the present invention to an MBE device using a MgZnCdSSe material. Reference numeral 11 denotes a high purity nitrogen gas cylinder, 12 a flow controller, 131 and 132 valves, 141 a nitrogen gas activating unit (osmium particles 141-1 and a heater), 142 a zinc raw material crucible (metal zinc and heater), 143 a cadmium raw material crucible (metal cadmium and a heater), 144 magnesium raw material crucible (metal magnesium and a heater), 145 a selenium raw material crucible (metal selenium and a heater), 146 a sulfur raw material crucible (zinc sulfide and a heater), 151 through 156 shutters for respective raw materials, 16 a main shutter, 17 a substrate holder, 18 a substrate, 19 a liquid nitrogen cooling type growth chamber, and 20 a heater control power supply. In FIGS. 3A and 3B there are shown only parts related to the invention, and a high vacuum evacuating unit, a reflection high energy electron diffraction device, an analysis chamber, a substrate loading chamber and so forth which are usually provided in the MBE device but are not shown for the sake of brevity. In this example, the osmium 141-1 is provided in a granulated form to increase its surface area for enhancement of the volumetric efficiency. Since the granulated osmium readily oxidizes in the air, it is sealed in a vessel provided with a leak-tight shutter 141-3 to keep it from exposure to an oxiding atmosphere when the growth chamber is opened for maintenance, for example. The nitrogen gas 141-4 are chemically adsorbed to the surfaces of the heated osmium particles 141-1 and after a certain elapsed time it is deserted from the osmium particles while remaining active. This active nitrogen becomes beam-like in the growth chamber evacuated to a high vacuum and reaches the vicinity of the substrate 18 like other raw material molecular beams. Then it is physically adsorbed to the surface of the group II-VI compound being grown and incorporated into crystals therein.

Figure 4:
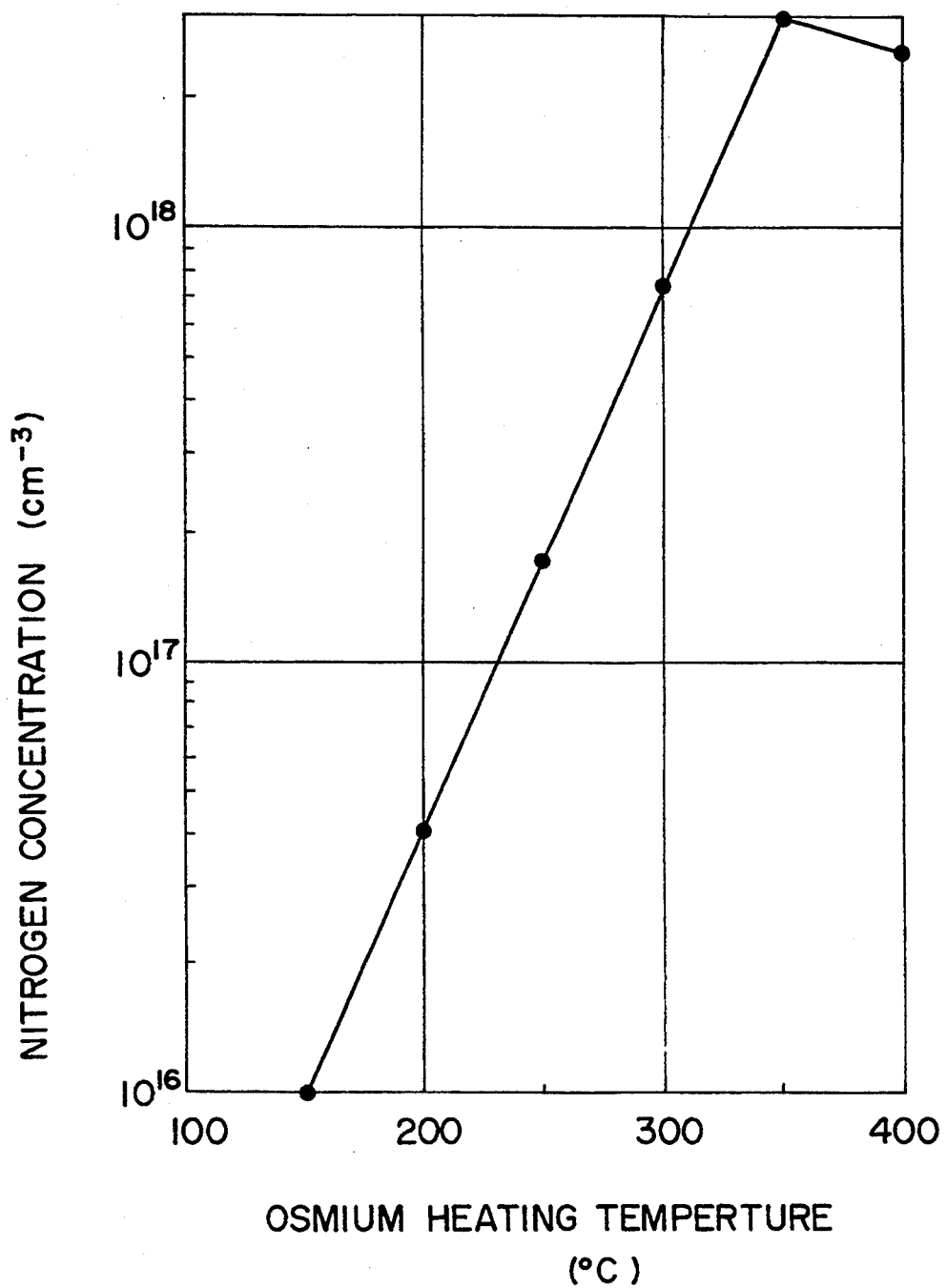
FIG. 4 is a graph showing the relationships of a ZnSe crystal grown by the device of FIG. 3A to the osmium heating temperature and the nitrogen concentration in the thin film.

FIG. 4 shows the relationships of a ZnSe crystal grown by the above-described device to the osmium heating temperature and the nitrogen concentration in the film. The substrate temperature is 202° C. and the flow rate of nitrogen is 0.25 CCM. A maximum nitrogen concentration of $3 \times 10^{18}$ cm$^{-3}$, which demonstrates effective doping of nitrogen. [Embodiment 3]

While Embodiments 1 and 2 have been described using some wide energy gap group II-VI compounds, the present invention is not limited specifically thereto. The invention is applicable as well to the manufacture of nitrogen-doped thin films of group II-IV compounds of narrow energy gap, such as cadmium zinc telluride and mercury cadmium telluride. The osimum has been described to be provided in the form of a plate in Embodiment 1 and in the granulated form in Embodiment 2, but it may also be provided in any other forms if it is kept from oxidation as in Embodiment 2; for example, it may be provided in the form of a honeycomb, orifice, porous block (sponge), or powder.

As described above, the present invention permits doping of nitrogen into group II-VI compound semiconductor films with a very simplie method. With the invention, it is possible to manufacture the nitrogen-doped thin film which has been particularly difficult with the MOVPE process. Besides, the invention also allows the MBE process to manufacture nitrogen-doped thin films with the use of only a simple hearing unit, instead of using a complex, expensive plasma generating device.

What we claim is:

1. A method for manufacturing a group II-VI compound semi-conductor thin film on a semiconductor substrate by a MOVPE process, comprising the steps of:

blowing a nitrogen gas against an osmium material heated and positioned near the semiconductor substrate in a reaction chamber to be chemically absorbed onto the surface of the osmium material, so that the absorbed nitrogen is then desorbed from the surface of the osmium material and reaches the vicinity of the semiconductor substrate while remaining active; and growing a group II-VI compound semiconductor thin film on the semiconductor substrate held in the reaction chamber while physically absorbing the desorbed nitrogen onto the surface of the group II-VI compound semiconductor thin film to be incorporated to crystals thereof.

2. A method for manufacturing a group II-VI compound semiconductor thin film on a semiconductor substrate by an MBE process, comprising the steps of:

blowing a nitrogen gas against osmium particles heated and positionned near the semiconductor substrate in a reaction chamber to be chemically absorbed onto the surface of the osmium particles, so that the absorbed nitrogen is then desorbed in a beam from the surfaces of the osmium particles and reaches the vicinity of the semicondcutor substrate while remaining active; and growing a group II-VI compound semiconductor thin film on the semiconductor substrate held in the reaction chamber while physically absorbing the desorbed nitrogen onto the surface of the group II-VI compound semiconductor thin film to be incorporated to crystals thereof.

3. A method for manufacturing a group II-VI compound semiconductor thin film on a semiconductor substrate, comprising the steps of:

providing a heated osmium material as a catalyst in a reaction chamber to activate nitrogen gas blown thereon in a MOVPE or MBE process; and growing a thin film on a semiconductor substrate in the reaction chamber while physically absorbing the activated nitrogen onto the surface of the grown group II-VI compound semiconductor thin film to be incorporated to crystals thereof.

* * * * *